(12) United States Patent
Wu et al.

(10) Patent No.: US 11,800,677 B2
(45) Date of Patent: Oct. 24, 2023

(54) POWER ADAPTER

(71) Applicant: Huawei Digital Power Technologies Co., Ltd., Shenzhen (CN)

(72) Inventors: Hao Wu, Xi'an (CN); Jun Chen, Dongguan (CN); Chunxia Xu, Dongguan (CN); Xiaowei Hui, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 121 days.

(21) Appl. No.: 17/665,225

(22) Filed: Feb. 4, 2022

(65) Prior Publication Data
US 2022/0256733 A1    Aug. 11, 2022

(30) Foreign Application Priority Data
Feb. 7, 2021 (CN) .......................... 202110177208.0

(51) Int. Cl.
*H01R 13/66* (2006.01)
*H05K 7/20* (2006.01)
*H01R 24/68* (2011.01)

(52) U.S. Cl.
CPC ....... *H05K 7/20145* (2013.01); *H01R 13/665* (2013.01); *H01R 24/68* (2013.01); *H05K 7/20909* (2013.01)

(58) Field of Classification Search
CPC ........... H05K 7/20145; H05K 7/20154; H05K 7/20918; H05K 7/20909; H05K 7/2039; H05K 7/20136; H05K 5/0213; H05K 5/0217; H05K 7/2089; G06F 1/20; G06F 1/26; H01L 23/467; H01R 24/68; H01R 13/665; H01R 31/065; H01R 13/46; H01R 13/04; H01R 13/66; H01R 13/6658; H01R 24/28; H02M 7/003
USPC ..... 361/695, 690, 679.49, 719, 679.46, 730, 361/752
See application file for complete search history.

(56) References Cited

U.S. PATENT DOCUMENTS

| | | | | |
|---|---|---|---|---|
| 5,773,755 | A * | 6/1998 | Iwatare | H05K 7/20618 174/17 VA |
| 5,869,919 | A * | 2/1999 | Sato | H01J 29/006 313/496 |
| 6,081,425 | A | 6/2000 | Cheng | |
| 6,348,653 | B1 * | 2/2002 | Cho | H05K 9/0041 174/394 |

(Continued)

FOREIGN PATENT DOCUMENTS

| | | |
|---|---|---|
| AU | 2018101461 B4 | 5/2019 |
| EP | 1656009 A2 | 5/2006 |

(Continued)

*Primary Examiner* — Mandeep S Buttar
(74) *Attorney, Agent, or Firm* — Leydig, Voit & Mayer, Ltd.

(57) ABSTRACT

A power adapter includes a housing, a circuit board component, and a heat dissipation air duct. The housing has an air inlet and an air outlet, the circuit board component is located inside the housing, the heat dissipation air duct is located in the housing and/or a spacing area between the housing and the circuit board component, the heat dissipation air duct surrounds the circuit board component and is connected to the air inlet and the air outlet, and the heat dissipation air duct is configured to dissipate heat from the housing and/or the circuit board component.

18 Claims, 10 Drawing Sheets

(56) References Cited

U.S. PATENT DOCUMENTS

| | | | | |
|---|---|---|---|---|
| 6,968,124 B1 * | 11/2005 | Varanasi | ............. | A01M 1/2077 |
| | | | | 392/395 |
| 7,929,301 B2 | 4/2011 | Fong et al. | | |
| 7,978,489 B1 * | 7/2011 | Telefus | ................ | H01R 31/065 |
| | | | | 363/142 |
| 9,024,581 B2 * | 5/2015 | McGinley | ............ | H02J 7/0042 |
| | | | | 320/111 |
| 9,055,699 B2 * | 6/2015 | Osato | ................ | H05K 7/20909 |
| 9,564,720 B2 * | 2/2017 | Zhang | ................... | H01R 24/30 |
| 11,026,343 B1 * | 6/2021 | Telefus | ................ | H05K 7/2039 |
| 2006/0087815 A1 | 4/2006 | Lanni | | |
| 2014/0268564 A1 | 9/2014 | Sagneri et al. | | |
| 2018/0203497 A1 * | 7/2018 | Sagneri | ................... | G06F 1/206 |

FOREIGN PATENT DOCUMENTS

| | | |
|---|---|---|
| EP | 1701604 A1 | 9/2006 |
| JP | H0767231 B2 | 7/1995 |
| JP | 2003060371 A | 2/2003 |
| TW | M600506 U | 8/2020 |

\* cited by examiner

POWER ADAPTER

CROSS-REFERENCE TO RELATED APPLICATION

This application claims priority to Chinese Patent Application No. 202110177208.0, filed on Feb. 7, 2021, which is hereby incorporated by reference in its entirety.

TECHNICAL FIELD

This application relates to the field of heat dissipation technologies, and in particular, to a power adapter.

BACKGROUND

With rapid development of electronic devices such as a smartphone and a notebook computer, a power adapter is widely used in people's life and office field as an auxiliary apparatus for power supply voltage conversion. When the adapter works, an internal electronic element generates a relatively large amount of heat, and heat dissipation processing needs to be performed in time to release heat inside the adapter. However, a conventional power adapter has a low heat dissipation capability and low heat dissipation reliability.

SUMMARY

Embodiments of this application provide a power adapter, to improve a thermal conduction capability of the power adapter, so that heat dissipation reliability is high.

The embodiments of this application provide a power adapter, and the power adapter includes:
  a housing, where the housing has an air inlet and an air outlet;
  a circuit board component, where the circuit board component is located inside the housing; and
  a heat dissipation air duct, where the heat dissipation air duct is located in the housing and/or a spacing area between the housing and the circuit board component, the heat dissipation air duct surrounds the circuit board component and is connected to the air inlet and the air outlet, and the heat dissipation air duct is configured to dissipate heat from the housing and/or the circuit board component.

It can be understood that the housing has the air inlet and the air outlet, and both the air inlet and the air outlet are connected to the heat dissipation air duct. The air inlet may be understood as an opening through which natural air can enter the power adapter from an environment outside the power adapter, and the air outlet may be understood as an opening through which air carrying heat of the power adapter can flow into an external environment from the power adapter. Cold air enters the power adapter through the air inlet, and during flowing in the heat dissipation air duct inside the power adapter, the cold air carries heat generated by the power adapter and becomes hot air. The hot air flows out of the power adapter through the air outlet, and flows into the external environment. The cold air and the hot air alternatively circulate circle-by-circle, so as to complete uninterrupted heat exchange between the power adapter and the external environment, thereby ensuring that the power adapter always has good thermal conduction performance.

In this way, the heat dissipation air duct is disposed, and the heat dissipation air duct surrounds the circuit board component, so that the heat dissipation air duct can be used as a main heat dissipation structure to completely surround the circuit board component. In one aspect, heat generated at any location of the circuit board component can be conducted to the heat dissipation air duct, and heat conducted to the circuit board component can be effectively dispersed by using air flowing in the heat dissipation air duct, thereby reducing thermal conduction resistance and a temperature of the circuit board component. In another aspect, the heat dissipation air duct is directly in contact with the housing, so that the heat dissipation air duct can fully play a temperature uniformity function, and temperature differences at all locations of the housing are uniform. Therefore, the power adapter has a good thermal conduction temperature difference and heat transfer efficiency as a whole, thereby effectively improving thermal conduction performance of the power adapter.

In addition, the heat dissipation air duct may be arranged in the housing, may be arranged in the spacing area between the housing and the circuit board component, or may be arranged in both the housing and the spacing area between the housing and the circuit board component. In other words, the heat dissipation air duct has diversified arrangement solutions, and may be flexibly arranged based on a requirement in actual application. In one aspect, it is conducive to adapt to heat dissipation requirements of the power adapter in a plurality of scenarios, and heat dissipation reliability is high. In another aspect, a thermal conduction capability of the power adapter can be improved, so that a temperature at a maximum temperature point of the housing can be greatly reduced in a condition in which the power adapter has same charging power. In other words, when heat is dissipated from a maximum temperature point of the housing in a same condition, that is, when a same heat dissipation target is achieved, a heat dissipation capability of the power adapter can be greatly improved. This helps better improve charging power of the power adapter and use experience of a user.

In addition, arrangements of the heat dissipation air duct are differentiated, so that the heat dissipation air duct can have dual effects of dissipating heat from the circuit board component and the housing. Heat can be conducted from a high-temperature area of the housing to a low-temperature area of the housing through forced air cooling, thereby facilitating temperature uniformity performance of the housing and improving use experience of a user. In addition, a temperature at a corresponding maximum temperature point inside the power adapter can be reduced, thereby avoiding a failure of the power adapter due to local overheat.

In other words, according to the technical solution of this application, the heat dissipation air duct connected to the air inlet and the air outlet of the housing is disposed, and the heat dissipation air duct has diversified arrangement forms. In one aspect, an engineering limit of natural heat dissipation in a conventional technology can be broken through to improve the heat dissipation capability of the power adapter. In another aspect, the thermal conduction capability of the power adapter is optimized, so that power of the power adapter can be further improved, and reliability of the power adapter is high.

In a possible implementation, the heat dissipation air duct is located in the spacing area between the housing and the circuit board component, at least a part of the housing is in a double-layer housing structure, a gap area in the double-layer housing structure forms a sealing cavity, and the sealing cavity is filled with a cooling medium.

It can be understood that after a temperature of the housing rises due to heating of an element inside the power adapter, the cooling medium filled in the sealing cavity can rapidly circularly flow under driving of heat to form heat convection, so that heat is conducted from a high-temperature area to a low-temperature area, thereby fully ensuring temperature uniformity performance of the housing. In this disposing, the cooling medium filled in the sealing cavity may be used as an auxiliary heat dissipation structure to assist the heat dissipation air duct inside the power adapter, thereby further improving heat dissipation performance of the power adapter. In one aspect, this helps greatly reduce a temperature at a maximum temperature point, and protect an internal heating component. In another aspect, when the housing is impacted by external force, the gap area in the double-layer housing structure may be used as a buffer to effectively prevent an internal structure of the power adapter from being damaged due to an impact, thereby greatly improving an impact resistance capability of the housing, and enabling the housing to meet a requirement of a higher impact resistance level.

In a possible implementation, the housing includes a middle housing and a front cover and a rear cover that are respectively connected to two ends of the middle housing, and one or more of the middle housing, the front cover, and the rear cover each are in the double-layer housing structure.

It can be understood that the housing may be completely in the double-layer housing structure, that is, the front cover, the rear cover, and the middle housing each are in the double-layer housing structure. Alternatively, the housing may be partially in the double-layer housing structure, that is, one or two of the middle housing, the front cover, and the rear cover each are in the double-layer housing structure. For example, the middle housing is in the double-layer housing structure, the middle housing and the front cover each are in the double-layer housing structure, or the middle housing and the rear cover each are in the double-layer housing structure. In this way, at least the middle housing is disposed as the double-layer housing structure, so as to better disperse and conduct heat generated by an electronic element on a circuit board to implement temperature uniformity of the housing, thereby helping improve an overall heat dissipation effect of the power adapter and use experience of a user.

In a possible implementation, the middle housing, the front cover, and the rear cover are in an integrated structure, or the middle housing and the front cover are in an integrated structure, or the middle housing and the rear cover are in an integrated structure.

It can be understood that the front cover, the middle housing, and the rear cover each may be in a separated structure, and may be connected through buckling, a snap-fit, fastening using a connector (such as a screw), or the like. A plurality of the front cover, the middle housing, and the rear cover may be in an integrated structure. For example, the middle housing, the front cover, and the rear cover are in the integrated structure, or the middle housing and the front cover are in the integrated structure, or the middle housing and the rear cover are in the integrated structure. The integrated structure is relatively easy to process, which helps reduce material processing costs of the power adapter and improve production efficiency of the power adapter. In addition, materials of the front cover, the middle housing, and the rear cover may be the same or may be different. When a plurality of structures in the front cover, the middle housing, and the rear cover each have a double-layer housing structure, the plurality of structures may have a same double-layer housing structure, or may have different double-layer housing structures. This is not strictly limited in this embodiment.

In a possible implementation, the housing includes an inner-layer housing and an outer-layer housing disposed on a periphery of the inner-layer housing, there is a gap between the inner-layer housing and the outer-layer housing, and a gap area between the inner-layer housing and the outer-layer housing forms the heat dissipation air duct.

In this way, disposing of the inner-layer housing and the outer-layer housing enables the housing to be in the double-layer housing structure, and the spacing area between the inner-layer housing and the outer-layer housing forms the heat dissipation air duct, so that a structure form of the housing can be fully used. Therefore, when a temperature of the housing rises due to heating of an element inside the power adapter, air can rapidly circularly flow in the heat dissipation air duct to take away heat of the power adapter, thereby fully ensuring temperature uniformity performance of the housing. In one aspect, this helps greatly reduce a temperature at a maximum temperature point, and protect an internal heating component. In another aspect, when the housing is impacted by external force, the gap area between the inner-layer housing and the outer-layer housing may be used as a buffer to effectively prevent an internal structure of the power adapter from being damaged due to an impact, thereby greatly improving an impact resistance capability of the housing, and enabling the housing to meet a requirement of a higher impact resistance level.

In a possible implementation, thermal conductivity of the inner-layer housing is greater than thermal conductivity of the outer-layer housing.

To be specific, the outer-layer housing may be formed by using a material with relatively small thermal conductivity to keep an external touch temperature of the housing at an acceptable low level. The inner-layer may be formed by using a material with relatively large thermal conductivity to better conduct and disperse heat inside the adapter, thereby helping disperse heat from the inside to the outside.

In a possible implementation, an inner wall of the housing is directly in contact with the circuit board component; or
the inner wall of the housing is connected to the circuit board component by using a thermally conductive medium; or
there is a gap between the inner wall of the housing and the circuit board component.

In a possible implementation, the housing includes a first surface, a first accommodation groove for accommodating a first pin and a second accommodation groove for accommodating a second pin are disposed on the first surface, and the first accommodation groove and the second accommodation groove are disposed at intervals; and
the air inlet is disposed on a groove wall of the first accommodation groove, and the air outlet is disposed on a groove wall of the second accommodation groove.

It can be understood that cold air enters the heat dissipation air duct through the air inlet disposed in the first accommodation groove, and flows in the heat dissipation air duct. Because the cold air flows in the heat dissipation air duct in a circumferential direction to take away heat, the cold air flowing in the heat dissipation air duct becomes hot air due to a temperature rise. After flowing one circle, the hot air flows out of the power adapter through the air outlet disposed in the second accommodation groove, to cool the power adapter through heat exchange.

The air inlet and the air outlet are respectively disposed in the first accommodation groove and the second accommodation groove. In one aspect, the first accommodation groove can have dual effects of accommodating the first pin and guiding cold air to enter the power adapter, and the second accommodation groove can have dual effects of accommodating the second pin and guiding hot air to flow out of the power adapter. In another aspect, this can reduce, to a maximum extent, a possibility of occurrence of a problem that the housing is prone to damage and an appearance specification of the power adapter is not met, because the air inlet and the air outlet are additionally disposed on a surface of the housing. Therefore, ventilation (air intake and air exhaust) of the power adapter is implemented while an appearance requirement and a safety specification requirement of the power adapter are met, so that heat dissipation performance is excellent.

It should be understood that a size of the first accommodation groove is greater than a size of the first pin, so as to reserve space that enables air to enter the power adapter, so that the air can successfully enter the power adapter. A size of the second accommodation groove is greater than a size of the second pin, so as to reserve space that enables air to flow out of the power adapter, so that air carrying heat can successfully flow out of the power adapter.

In a possible implementation, the housing includes a first surface and a second surface that are disposed opposite to each other, a first accommodation groove for accommodating a first pin and a second accommodation groove for accommodating a second pin are disposed on the first surface, and the first accommodation groove and the second accommodation groove are disposed at intervals; and the air inlet is disposed on the second surface, the air outlet includes a first sub-air outlet and a second sub-air outlet, the first sub-air outlet is disposed on a groove wall of the first accommodation groove, and the second sub-air outlet is disposed on a groove wall of the second accommodation groove.

It can be understood that cold air enters the heat dissipation air duct through the air inlet disposed on the second surface, and is divided into two parts. One part flows towards the air outlet side of the first accommodation groove, and the other part flows towards the air outlet side of the second accommodation groove. The two parts of cold air flow in the heat dissipation air duct and cooperate with each other to surround the circuit board component, so as to cooperate with each other to take away heat of the power adapter. In addition, the cold air flowing in the heat dissipation air duct becomes hot air due to a temperature rise. One part of the hot air flows out of the power adapter through the air outlet disposed in the first accommodation groove, and the other part of the hot air flows out of the power adapter through the air outlet disposed in the second accommodation groove, to cool the power adapter through heat exchange.

The air inlet is disposed on the second surface, the first sub-air outlet and the second sub-air outlet are respectively disposed in the first accommodation groove and the second accommodation groove, so that the first accommodation groove can have dual effects of accommodating the first pin and guiding hot air to flow out of the power adapter, and the second accommodation groove can have dual effects of accommodating the second pin and guiding hot air to flow out of the power adapter. Therefore, heat dissipation performance is excellent.

It should be understood that a size of the first accommodation groove is greater than a size of the first pin, so as to reserve space that enables air to enter the power adapter, so that the air can successfully enter the power adapter. A size of the second accommodation groove is greater than a size of the second pin, so as to reserve space that enables air to flow out of the power adapter, so that air carrying heat can successfully flow out of the power adapter.

In a possible implementation, the power adapter further includes a heat dissipation fan, and at least a part of the heat dissipation fan is located in the heat dissipation air duct and is disposed close to the air inlet.

It can be understood that the heat dissipation fan is a power source that enables air in the heat dissipation air duct to flow, and at least a part of the heat dissipation fan is located in the heat dissipation air duct and is disposed close to the air inlet, and the heat dissipation fan may be electrically connected to the circuit board component. In this way, under driving of the heat dissipation fan, air entering the power adapter through the air inlet can flow in the heat dissipation air duct, thereby helping improve fluidity of the air and heat dissipation performance of the power adapter. For example, a part of the heat dissipation fan is located in the heat dissipation air duct, and the other part of the heat dissipation fan is exposed at the air inlet; or the heat dissipation fan is completely located in the heat dissipation air duct. The heat dissipation fan may be but is not limited to a centrifugal fan, an axial flow fan, and a piezoelectric fan.

In a possible implementation, the power adapter further includes an antistatic structure, at least a part of the antistatic structure is located at the air inlet and/or the air outlet, and the antistatic structure is electrically connected to the circuit board component.

In this way, the antistatic structure is disposed at an opening of the housing, and the antistatic structure is electrically connected to the circuit board. Therefore, after static electricity is generated, the static electricity can be directly conducted to a ground of the circuit board to implement electrostatic shielding, so as to avoid impact caused on working performance of the power adapter (for example, a pin of a conductive metal material is impacted).

DESCRIPTION OF EMBODIMENTS

Figure 1:
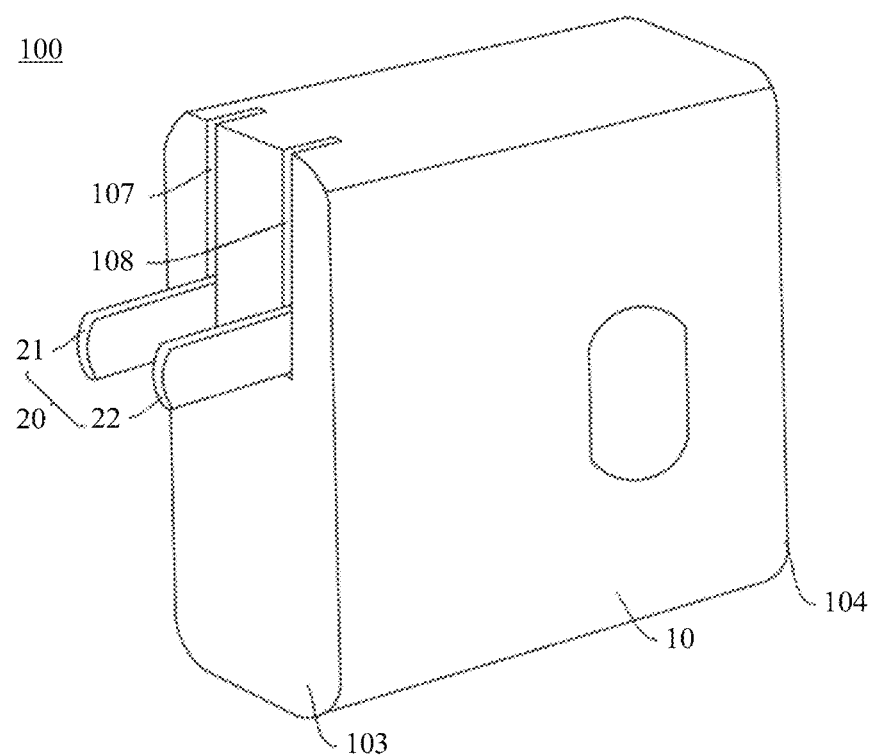
FIG. 1 is a schematic diagram of a structure of a power adapter according to an embodiment of this application.

For ease of understanding, terms used in the embodiments of this application are first explained.

The term "and/or" describes only an association relationship for describing associated objects and represents that three relationships may exist. For example, A and/or B may represent the following three cases: only A exists, both A and B exist, and only B exists.

"A plurality of" means "two or more".

Fastening should be understood broadly. For example, that A is fastened to B may be that A is directly connected to B and relative locations do not change after connection, or may be that A is indirectly connected to B by using an intermediate medium and relative locations do not change after connection.

Specific implementations of this application are clearly described below with reference to the accompanying drawings.

An embodiment of this application provides a power adapter. Based on a requirement, the power adapter may be configured to transmit rated output power (such as 22.5 W or 40 W). A volume of the power adapter can be as small as possible if allowed, and the power adapter can support slow charging and fast charging. The power adapter may be an adapter of a mobile terminal, may be an adapter of a large household appliance, or may be an adapter of a device such as a server or a data center. For example, the power adapter may be but is not limited to a mobile phone adapter, a tablet computer adapter, a notebook computer adapter, or an in-vehicle charger.

In this embodiment of this application, for ease of understanding, a mobile phone adapter, a power adapter that has a wide user range and rich application scenarios, is used as an example for description, but this is not limited thereto.

With reference to FIG. 1 to FIG. 11, a power adapter 100 includes a housing 10, a pin 20, a universal serial bus (USB) interface 30, a circuit board component 40, a heat dissipation air duct 50, and a heat dissipation fan 60. Arrow directions in FIG. 1 to FIG. 11 are air flowing directions.

The housing 10 is a housing structure of the power adapter 100, and can accommodate and encapsulate various parts of the power adapter 100, so as to prevent the various parts of the power adapter 100 from being invaded by external dust, water vapor, and the like. Therefore, the housing 10 has good protection performance. However, in a process of using the power adapter 100, the housing 10 generates a maximum temperature point due to heat accumulation, and the power adapter 100 can directly exchange heat with a human body, an object, and an external environment due to an appearance structure of the housing 10. Therefore, a temperature of the housing 10 directly affects working performance and a service life of the power adapter 100.

The pin 20 is an input port of the power adapter 100 and is connected to the housing 10, and may be exposed in an external environment, so that the pin 20 can be plug-connected to an external power supply to form a reliable electrical connection relationship between the external power supply and the power adapter 100, and the external power supply supplies power to the power adapter 100. Specifically, one end of the pin 20 is connected to the housing 10, and the other end of the pin 20 is configured to electrically connect to the external power supply. The pin 20 is electrically connected to the circuit board component 40 to supply power to the circuit board component 40 as an electrically conductive part.

It should be noted that specifications such as a material, a shape, a quantity, and a size of the pin 20 may be set based on actual application. This is not strictly limited in this embodiment of this application. For example, there may be two pins 20, so that the power adapter 100 presents a form of a two-pin plug. There may alternatively be three pins 20, so that the power adapter 100 presents a form of a three-pin plug.

For example, the pin 20 may be rotatably connected to the housing 10. In other words, the pin 20 can rotate relative to the housing 10, so that when electrical connection needs to be performed, the pin 20 is exposed outside the housing 10 to be plug-connected to the external power supply. When electrical connection does not need to be performed, the pin 20 is accommodated in the housing 10 without occupying large space of the power adapter 100, thereby facilitating storage and miniaturization of the power adapter 100.

The USB interface 30 is an output port of the power adapter 100, and is disposed on a surface of the housing 10 and electrically connected to the circuit board component 40. The USB interface 30 can be connected to a to-be-charged device. A quantity of USB interfaces 30 may be selected based on an actual application requirement, and there may be one or more USB interfaces. Specifically, when there is one USB interface 30, the power adapter 100 is configured to be able to charge one to-be-charged device. However, when there are a plurality of USB interfaces 30, the power adapter 100 is configured to be able to simultaneously charge a plurality of to-be-charged devices. Certainly, another type of interface may be disposed on the housing 10 based on an application requirement. This is not strictly limited in this embodiment of this application.

For example, the pin 20 and the USB interface 30 may be disposed on two surfaces of the housing 10 that are disposed adjacent to each other, or the pin 20 and the USB interface 30 may be disposed on two surfaces of the housing 10 that are disposed opposite to each other.

The circuit board component 40 is a core part of the power adapter 100 and is accommodated inside the housing 10, and can integrate important parts of the power adapter 100 together to play their respective functions. The circuit board component 40 may include a circuit board 41 and a plurality of electronic elements 42 disposed on the circuit board 41. The circuit board 41 may be understood as a carrier of the electronic element 42. The circuit board 41 not only can provide functions such as electrical connection, protection, support, heat dissipation, and assembly to the electronic element 42, but also can be used as a thermally conductive part to conduct heat of the electronic element 42. The electronic element 42 may be understood as a part that generates heat in a working process of the power adapter 100. The electronic element 42 may be attached to the circuit board 41 to transfer heat to the circuit board 41. For example, the electronic element 42 may be a chip or a circuit.

The heat dissipation air duct 50 is a main heat dissipation structure of the power adapter 100. With a good heat dissipation effect of the heat dissipation air duct 50, heat (such as heat generated by the circuit board component 40) inside the power adapter 100 can be effectively dispersed to an external environment in time, and the housing 10 can be cooled, thereby improving heat dissipation reliability during normal working of the power adapter 100. For example, the heat dissipation air duct 50 is located in the housing 10 and/or a spacing area between the housing 10 and the circuit board component 40, the heat dissipation air duct 50 surrounds the circuit board component 40, and the heat dissipation air duct 50 is configured to dissipate heat from the housing 10 and/or the circuit board component 40.

In this way, the heat dissipation air duct 50 is disposed, and the heat dissipation air duct 50 surrounds the circuit board component 40, so that the heat dissipation air duct 50 can be used as a main heat dissipation structure to completely surround the circuit board component 40. In one aspect, heat generated at any location of the circuit board component 40 can be conducted to the heat dissipation air duct 50, and heat conducted by the circuit board component 40 can be effectively dispersed by using air flowing in the heat dissipation air duct 50, thereby reducing thermal conduction resistance and a temperature of the circuit board component 40. In another aspect, the heat dissipation air duct 50 is directly in contact with the housing 10, so that the heat dissipation air duct 50 can fully play a temperature uniformity function, and temperature differences at all locations of the housing 10 are uniform. Therefore, the power adapter 100 has a good thermal conduction temperature difference and heat transfer efficiency as a whole, thereby effectively improving thermal conduction performance of the power adapter 100.

In addition, the heat dissipation air duct 50 may be arranged in the housing 10, may be arranged in the spacing area between the housing 10 and the circuit board component 40, or may be arranged in both the housing 10 and the spacing area between the housing 10 and the circuit board component 40. In other words, the heat dissipation air duct 50 has diversified arrangement solutions, and may be flexibly arranged based on a requirement in actual application. In one aspect, it is conducive to adapt to heat dissipation requirements of the power adapter 100 in a plurality of scenarios, and heat dissipation reliability is high. In another aspect, a thermal conduction capability of the power adapter 100 can be improved, so that a temperature at a maximum temperature point of the housing 10 can be greatly reduced in a condition in which the power adapter 100 has same charging power. In other words, when heat is dissipated from a maximum temperature point of the housing 10 in a same condition, that is, when a same heat dissipation target is achieved, a heat dissipation capability of the power adapter 100 can be greatly improved. This helps better improve charging power of the power adapter 100 and use experience of a user.

In addition, arrangements of the heat dissipation air duct 50 are differentiated, so that the heat dissipation air duct 50 can have dual effects of dissipating heat from the circuit board component 40 and the housing 10. Heat can be conducted from a high-temperature area of the housing 10 to a low-temperature area of the housing 10 through forced air cooling, thereby facilitating temperature uniformity performance of the housing 10 and improving use experience of a user. In addition, a temperature at a corresponding maximum temperature point inside the power adapter 100 can be reduced, thereby avoiding a failure of the power adapter 100 due to local overheat.

In this embodiment of this application, the housing 10 has an air inlet 101 and an air outlet 102, and both the air inlet 101 and the air outlet 102 are connected to the heat dissipation air duct 50. The air inlet 101 may be understood as an opening through which natural air can enter the power adapter 100 from an environment outside the power adapter 100, and the air outlet 102 may be understood as an opening through which air carrying heat of the power adapter 100 can flow into an external environment from the power adapter 100. Cold air enters the power adapter 100 through the air inlet 101, and during flowing in the heat dissipation air duct 50 inside the power adapter 100, the cold air carries heat generated by the power adapter 100 and becomes hot air. The hot air flows out of the power adapter 100 through the air outlet 102, and flows into the external environment. The cold air and the hot air alternatively circulate circle-by-circle, so as to complete uninterrupted heat exchange between the power adapter 100 and the external environment, thereby ensuring that the power adapter 100 always has good thermal conduction performance.

For example, the air inlet 101 and the air outlet 102 may be configured on a same surface of the housing 10, or the air inlet 101 and the air outlet 102 may be configured on different surfaces (for example, two surfaces disposed opposite to each other) of the housing 10, only provided that heat surrounding the circuit board component 40 and the housing 10 can be taken away when air flows in the heat dissipation air duct 50. The air inlet 101 and the air outlet 102 may be disposed as a groove structure based on a requirement, or the air inlet 101 and the air outlet 102 may be designed as a hole structure based on a requirement. This is not strictly limited in this embodiment of this application. In addition, the power adapter 100 may further include an antistatic structure. At least a part of the antistatic structure is located at the air inlet 101 and/or the air outlet 102. The antistatic structure is electrically connected to the circuit board component 40 (for example, the ground of the circuit board 41). In this way, the antistatic structure is disposed at an opening of the housing 10, and the antistatic structure is electrically connected to the circuit board 41. Therefore, after static electricity is generated, the static electricity can be directly conducted to the ground of the circuit board 41 to implement electrostatic shielding, so as to avoid impact caused on working performance of the power adapter 100 (for example, the pin 20 of a conductive metal material is impacted). Alternatively, an outer surface of the housing 10 may be covered with a layer of an antistatic film to implement electrostatic shielding.

The heat dissipation fan 60 is a power source that enables air in the heat dissipation air duct 50 to flow, and at least a part of the heat dissipation fan 60 is located in the heat dissipation air duct 50 and is disposed close to the air inlet 101, and the heat dissipation fan 60 may be electrically connected to the circuit board component 40. In this way, under driving of the heat dissipation fan 60, air entering the power adapter 100 through the air inlet 101 can flow in the heat dissipation air duct 50, thereby helping improve fluidity of the air and heat dissipation performance of the power adapter 100. For example, a part of the heat dissipation fan 60 is located in the heat dissipation air duct 50, and the other part of the heat dissipation fan 60 is exposed at the air inlet 101; or the heat dissipation fan 60 is completely located in the heat dissipation air duct 50. The heat dissipation fan 60 may be but is not limited to a centrifugal fan, an axial flow fan, and a piezoelectric fan.

It should be noted that FIG. 1 to FIG. 11 are merely intended to describe an example of a connection relationship between the housing 10, the pin 20, the USB interface 30, the circuit board component 40, the heat dissipation air duct 50, and the heat dissipation fan 60, instead of specifically limiting connection locations, specific structures, and quantities of devices. However, the structure shown in this embodiment of this application constitutes no specific limitation on the power adapter 100. In some other embodiments of this application, the power adapter 100 may include more or fewer parts than those shown in the figure, or combine some parts, or split some parts, or have different part arrangements. The components shown in the figure may be implemented by using hardware, software, or a combination of software and hardware.

It can be understood that in a working process of the power adapter 100, as a heating element, the electronic element 42 generates a large amount of heat, so that a maximum temperature point is formed at a corresponding location inside the power adapter 100. A temperature at the maximum temperature point is relatively high. If heat generated at the maximum temperature point is not effectively dissipated in time, working performance of the power adapter 100 is directly affected. For example, the power adapter 100 fails if the power adapter 100 is locally overheated. In addition, a temperature of the housing 10 at the corresponding location of the maximum temperature point is also relatively high. As a result, causes the housing 10 is locally overheated, which severely affects user experience. In other words, a heat balance condition of the power adapter 100 directly affects working performance of the power adapter 100. This maximum temperature point problem is especially prominent in a power adapter 100 with a small size and high power. Consequently, power improvement and a miniaturization development trend of the power adapter 100 are limited.

Therefore, in this embodiment of this application, the heat dissipation air duct 50 connected to the air inlet 101 and the air outlet 102 of the housing 10 is disposed, and the heat dissipation air duct 50 has diversified arrangement forms. In one aspect, an engineering limit of natural heat dissipation in a conventional technology can be broken through to improve the heat dissipation capability of the power adapter 100. In another aspect, the thermal conduction capability of the power adapter 100 is optimized, so that power of the power adapter can be further improved, and reliability of the power adapter 100 is high.

A structure possibility of the power adapter 100 is described below by using two specific embodiments to describe structures and connection locations of the housing 10, the circuit board component 40, and the heat dissipation air duct 50, and a connection relationship between the housing 10, the circuit board component 40, and the heat dissipation air duct 50. It should be noted that only an example in which the heat dissipation air duct 50 is located in the housing 10 and an example in which the heat dissipation air duct 50 is located in the spacing area between the circuit board 41 and the housing 10 are used below for description. However, the heat dissipation air duct 50 may alternatively be located in both the housing 10 and the spacing area between the circuit board 41 and the housing 10. This is not limited thereto.

Embodiment 1

With reference to FIG. 1 to FIG. 8, in a first embodiment of this application, the heat dissipation air duct 50 is located in the spacing area between the housing 10 and the circuit board component 40. To be specific, the heat dissipation air duct 50 is in a shape of a ring and is disposed around the circuit board component 40 in a circumferential. In addition, when being in the shape of a ring, the heat dissipation air duct 50 can be fully in contact with an inner surface of the housing 10 (that is, a surface that is of the housing 10 and that is not exposed in an external environment), thereby ensuring that all locations of the housing 10 can be cooled through heat exchange with the heat dissipation air duct 50.

In this way, when flowing in the heat dissipation air duct 50, air can pass between the housing 10 and the circuit board component 40, and take away heat of the circuit board component 40 and the housing 10 through air cooling, so that heat dissipation reliability is high.

For example, there are two pins 20, which are respectively a first pin 21 and a second pin 22. The first pin 21 and the second pin 22 can rotate relative to the housing 10, so that the first pin 21 and the second pin 22 protrude relative to the housing 10 when electrical connection is required, and are accommodated in the housing 10 when electrical connection is not required.

Specifically, the housing 10 includes a first surface 103 and a second surface 104 that are disposed opposite to each other, a first accommodation groove 107 and a second accommodation groove 108 that are disposed at intervals are disposed on the first surface 103, and the USB interface 30 is disposed on the second surface 104. The first accommodation groove 107 is configured to accommodate the first pin 21, and the second accommodation groove 108 is configured to accommodate the second pin 22. When the first pin 21 and the second pin 22 need to be electrically connected to an external power supply, the first pin 21 and the second pin 22 protrude relative to the housing 10. Alternatively, when the first pin 21 and the second pin 22 do not need to be electrically connected to an external power supply, the first pin 21 and the second pin 22 are respectively accommodated in the first accommodation groove 107 and the second accommodation groove 108.

In this way, space for accommodating the pin 20 is configured on the housing 10, so that space occupied by the power adapter 100 can be reduced, thereby facilitating a miniaturization development trend of the power adapter 100.

Figure 2:
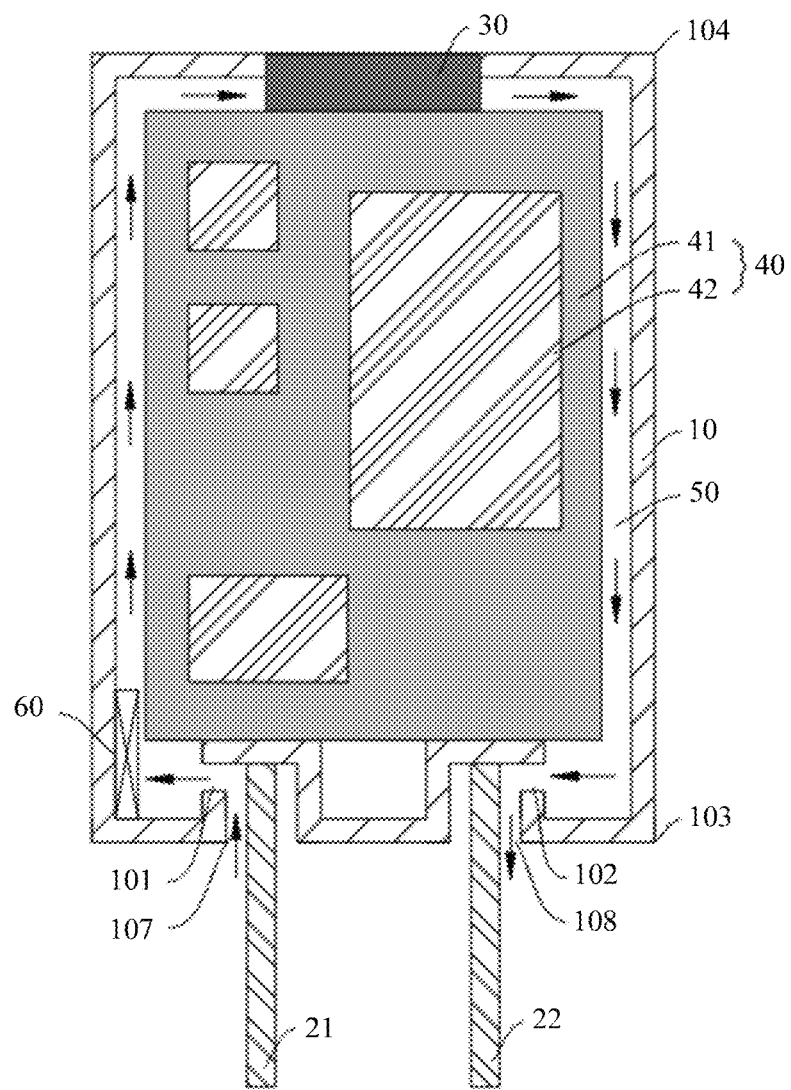
FIG. 2 is a schematic diagram of a first profile of a power adapter according to a first embodiment of this application.

With reference to FIG. 1 and FIG. 2, in a possible implementation, the air inlet 101 is disposed on a groove wall of the first accommodation groove 107, and the air inlet 101 is connected to the heat dissipation air duct 50. The air outlet 102 is disposed on a groove wall of the second accommodation groove 108, and the air outlet 102 is connected to the heat dissipation air duct 50. In other words, the air inlet 101 is disposed on the groove wall of the first accommodation groove 107, and the air outlet 102 is disposed on the groove wall of the second accommodation groove 108. For example, the air inlet 101 may be disposed close to a location at which the first pin 21 and the housing 10 are connected, and the air outlet 102 may be disposed close to a location at which the second pin 22 and the housing 10 are connected. This is not strictly limited in this embodiment provided that the air inlet 101 and the air outlet 102 are disposed on the groove wall of the first accommodation groove 107 and the groove wall of the second accommodation groove 108.

It can be understood that cold air enters the heat dissipation air duct 50 through the air inlet 101 disposed in the first accommodation groove 107, and flows in the heat dissipation air duct 50. Because the cold air flows in the heat dissipation air duct 50 in a circumferential direction to take away heat, the cold air flowing in the heat dissipation air duct 50 becomes hot air due to a temperature rise. After flowing one circle, the hot air flows out of the power adapter 100 through the air outlet 102 disposed in the second accommodation groove 108, to cool the power adapter 100 through heat exchange.

The air inlet 101 and the air outlet 102 are respectively disposed in the first accommodation groove 107 and the second accommodation groove 108. In one aspect, the first accommodation groove 107 can have dual effects of accommodating the first pin 21 and guiding cold air to enter the power adapter 100, and the second accommodation groove 108 can have dual effects of accommodating the second pin 22 and guiding hot air to flow out of the power adapter 100. In another aspect, this can reduce, to a maximum extent, a possibility of occurrence of a problem that the housing 10 is prone to damage and an appearance specification of the power adapter 100 is not met, because the air inlet 101 and the air outlet 102 are additionally disposed on a surface of the housing 10. Therefore, ventilation (air intake and air exhaust) of the power adapter 100 is implemented while an appearance requirement and a safety specification requirement of the power adapter 100 are met, so that heat dissipation performance is excellent.

It should be understood that a size of the first accommodation groove 107 is greater than a size of the first pin 21, so as to reserve space that enables air to enter the power adapter 100, so that the air can successfully enter the power adapter 100. A size of the second accommodation groove 108 is greater than a size of the second pin 22, so as to reserve space that enables air to flow out of the power adapter 100, so that air carrying heat can successfully flow out of the power adapter 100. Certainly, there may be three or more pins 20. The air inlet 101 and the air outlet 102 may be disposed on groove walls of accommodation grooves for accommodating different pins 20. This is not strictly limited.

In this implementation, the heat dissipation fan 60 may be completely located in the heat dissipation air duct 50, and may be at a location shown in FIG. 2. Certainly, a location of the heat dissipation fan 60 is not limited to the location shown in FIG. 2, and the heat dissipation fan 60 can be disposed at each location at which power can be provided to air entering the heat dissipation air duct 50 through the air inlet 101, to enable the air to flow. There may be one or more heat dissipation fans 60. This is not strictly limited.

Figure 3:
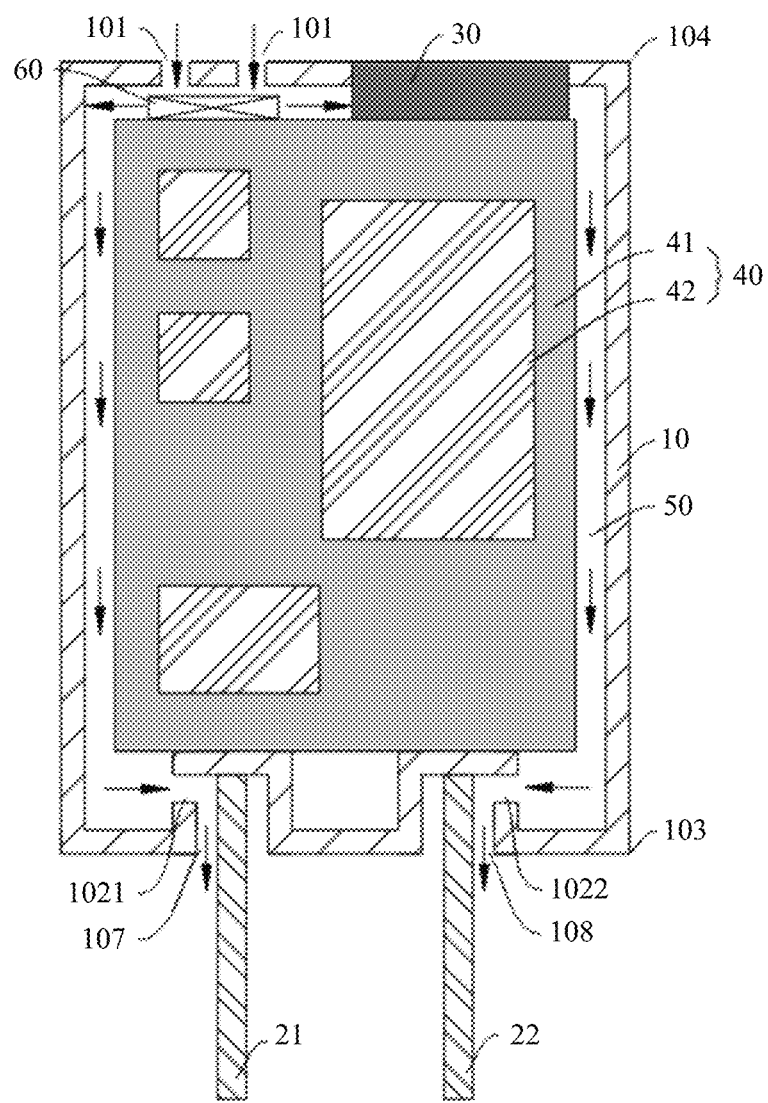
FIG. 3 is a schematic diagram of a second profile of a power adapter according to a first embodiment of this application.

With reference to FIG. 1 and FIG. 3, in another possible implementation, the air inlet 101 is disposed on the second surface 104, and is disposed spacing from the USB interface 30. The air inlet 101 is connected to the heat dissipation air duct 50. The air outlet 102 includes a first sub-air outlet 1021 and a second sub-air outlet 1022. The first sub-air outlet 1021 is disposed on the groove wall of the first accommodation groove 107, and the first sub-air outlet 1021 is connected to the heat dissipation air duct 50. The second sub-air outlet 1022 is disposed on the groove wall of the second accommodation groove 108, and the second sub-air outlet 1022 is connected to the heat dissipation air duct 50. In other words, the air inlet 101 is disposed on the second surface 104, the first sub-air outlet 1021 is disposed on the groove wall of the first accommodation groove 107, and the second sub-air outlet 1022 is disposed on the groove wall of the second accommodation groove 108.

It can be understood that cold air enters the heat dissipation air duct 50 through the air inlet 101 disposed on the second surface 104, and is divided into two parts. One part flows towards the first sub-air outlet 1021 side of the first accommodation groove 107, and the other part flows towards the second sub-air outlet 1022 side of the second accommodation groove 108. The two parts of cold air flow in the heat dissipation air duct 50 and cooperate with each other to surround the circuit board component 40, so as to cooperate with each other to take away heat of the power adapter 100. In addition, the cold air flowing in the heat dissipation air duct 50 becomes hot air due to a temperature rise. One part of the hot air flows out of the power adapter 100 through the first sub-air outlet 1021 disposed in the first accommodation groove 107, and the other part of the hot air flows out of the power adapter 100 through the second sub-air outlet 1022 disposed in the second accommodation groove 108, to cool the power adapter 100 through heat exchange.

The air inlet 101 is disposed on the second surface 104, the first sub-air outlet 1021 and the second sub-air outlet 1022 are respectively disposed in the first accommodation groove 107 and the second accommodation groove 108, so that the first accommodation groove 107 can have dual effects of accommodating the first pin 21 and guiding hot air to flow out of the power adapter 100, and the second accommodation groove 108 can have dual effects of accommodating the second pin 22 and guiding hot air to flow out of the power adapter 100. Therefore, heat dissipation performance is excellent.

It should be understood that a size of the first accommodation groove 107 is greater than a size of the first pin 21, so as to reserve space that enables air to enter the power adapter 100, so that the air can successfully enter the power adapter 100. A size of the second accommodation groove 108 is greater than a size of the second pin 22, so as to reserve space that enables air to flow out of the power adapter 100, so that air carrying heat can successfully flow out of the power adapter 100. Certainly, there may be three or more pins 20. The first sub-air outlet 1021 and the second sub-air outlet 1022 may be disposed on groove walls of accommodation grooves for accommodating different pins 20. This is not strictly limited.

Figure 4:
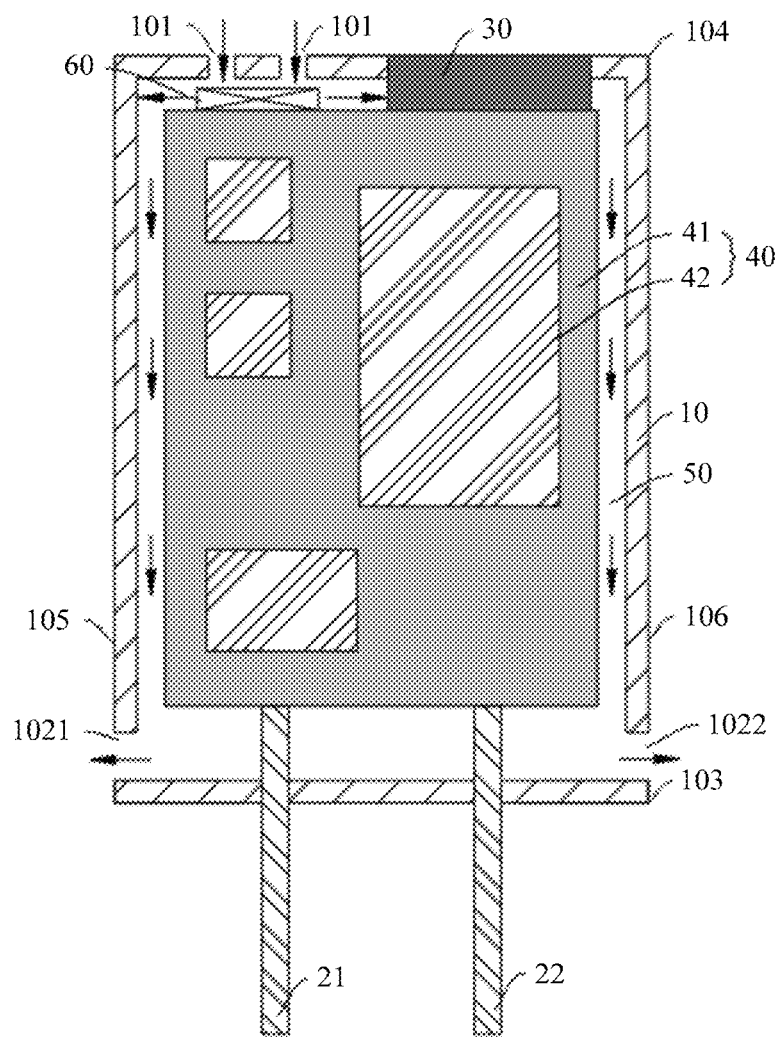
FIG. 4 is a schematic diagram of a third profile of a power adapter according to a first embodiment of this application.

In still another possible implementation, as shown in FIG. 4, the housing 10 further includes a third surface 105 and a fourth surface 106 that are connected between the first surface 103 and the second surface 104. The third surface 105 and the fourth surface 106 are disposed opposite to each other. The air inlet 101 is disposed on the second surface 104, and is disposed spacing from the USB interface 30. The air inlet 101 is connected to the heat dissipation air duct 50. The air outlet 102 includes a first sub-air outlet 1021 and a second sub-air outlet 1022. The first sub-air outlet 1021 and the second sub-air outlet 1022 are respectively disposed at a location at which the third surface 105 and the first surface 103 are connected and at a location at which the fourth surface 106 and the first surface 103 are connected. The first sub-air outlet 1021 and the second sub-air outlet are connected to the heat dissipation air duct 50. In other words, the air inlet 101 is disposed on the second surface 104, the first sub-air outlet 1021 is disposed at the location at which the third surface 105 and the first surface 103 are connected, and the second sub-air outlet 1022 is also disposed on the fourth surface 106 and the first surface 103.

Based on the foregoing description, it should be understood that disposing of the air inlet 101 and the air outlet 102 has diversified possibilities, and an arrangement solution for the air inlet 101 and the air outlet 102 is also not limited to the solution described above. An arrangement solution is applicable provided that air entering the heat dissipation air duct can surround the circuit board component 40. This is not strictly limited in this embodiment.

In this embodiment, the housing 10 may be in a structure of a solid housing 10 shown in FIG. 2 to FIG. 4, or the housing 10 may be in a structure of a hollow housing 10 shown in FIG. 5 to FIG. 8, and may be designed based on an actual requirement.

With reference to FIG. 2, FIG. 3, and FIG. 4, in a possible implementation, the housing 10 is in a solid housing structure. Therefore, strength of the housing 10 is high, and a possibility of occurrence of a case in which the housing 10 is damaged due to a mechanical impact can be minimized.

With reference to FIG. 5, FIG. 6, FIG. 7, and FIG. 8, in another possible implementation, at least a part of the housing 10 is in a double-layer housing structure, a gap area in the double-layer housing structure forms a sealing cavity 11, and the sealing cavity 11 is filled with a cooling medium. The double-layer housing structure may be understood as that the housing 10 has two layer-shaped housing structures, and there is a gap between the two layer-shaped housing structures.

It should be understood that the cooling medium may be a single substance, or the cooling medium may be a combination of a plurality of substances. The cooling medium may have a relatively high boiling point (for example, greater than or equal to 100° C.), so as to effectively avoid an adverse effect caused by liquid boiling and vaporization, thereby improving working performance and safety performance of the power adapter 100 in an extreme environment (for example, a high temperature environment). For example, for an area with a relatively high ambient temperature, a cooling medium with a relatively high boiling point may be selected. For an area with a relatively low ambient temperature, a cooling medium with a relatively low boiling point may be selected. The cooling medium may further have a relatively low freezing point (for example, less than or equal to 0° C.), so as to effectively avoid an adverse effect caused by solidification of the cooling medium, thereby improving effectiveness and safety of storing and using the power adapter 100 in an extreme environment (for example, a low temperature environment). For example, for an area with a relatively high ambient temperature, liquid with a relatively high freezing point may be selected. For an area with a relatively low ambient temperature, liquid with a relatively low freezing point that is uneasily to be frozen is selected as far as possible.

For example, the cooling medium may include one or a combination of a plurality of an antifreeze, water, methanol, ethanol, ethylene glycol, propylene glycol, glycerol, lubricant, sugar, and honey.

However, a filling amount of the cooling medium affects thermal conduction efficiency, thereby affecting a temperature uniformity effect. An excessively small filling amount causes a limited amount of transferred heat. Therefore, to better implement the temperature uniformity effect by using the cooling medium, a filling volume of the cooling medium may be greater than or equal to 80% of a total volume of the sealing cavity 11. In other words, a proportion occupied by a volume of the cooling medium in the total volume of the sealing cavity 11 is greater than or equal to 80%.

In this way, temperature uniformity can be better implemented through circularly flowing of the cooling medium, so as to avoid an adverse effect caused by a problem that the cooling medium violently shakes in the sealing cavity 11 due to a small quantity.

Figure 9:
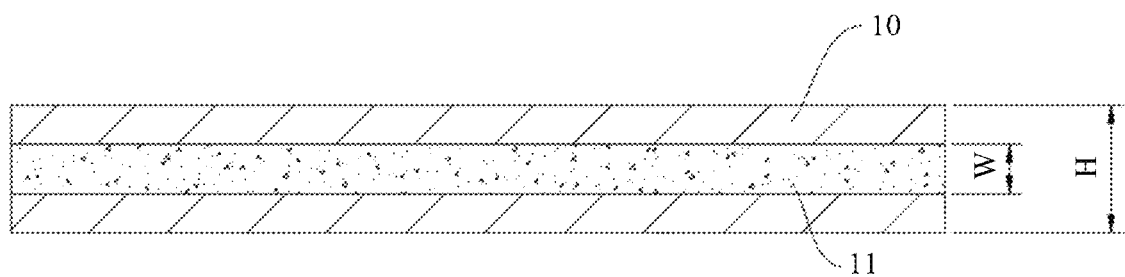
FIG. 9 is a schematic diagram of a partial profile of a power adapter according to a first embodiment of this application.

With reference to FIG. 9, a gap width W of the gap area in the double-layer housing structure may be less than or equal to 40% of a total thickness H of the housing 10. For example, the gap width W is 5% to 30% of the total thickness H of the housing 10, or the gap width W is 10% to 25% of the total thickness H of the housing 10, or the gap width W is 10% to 20% of the total thickness H of the housing 10. For example, the gap width W may be less than or equal to 1 mm. The total thickness H of the housing 10 may fall within a range from 1 mm to 2 mm.

In this way, the gap width W of the gap area in the double-layer housing structure is set to a proper size. In one aspect, an overall strength requirement of the housing 10 can be ensured, so that the housing 10 has a specific impact resistance capability. In another aspect, it can be relatively ensured that the cooling medium in the housing 10 has a sufficient volume to effectively play a temperature uniformity function.

It can be understood that after a temperature of the housing 10 rises due to heating of an element inside the power adapter 100, the cooling medium filled in the sealing cavity 11 can rapidly circularly flow under driving of heat to form heat convection, so that heat is conducted from a high-temperature area to a low-temperature area, thereby fully ensuring temperature uniformity performance of the housing 10. In this disposing, the cooling medium filled in the sealing cavity 11 may be used as an auxiliary heat dissipation structure to assist the heat dissipation air duct 50 inside the power adapter 100, thereby further improving heat dissipation performance of the power adapter 100. In one aspect, this helps greatly reduce a temperature at a maximum temperature point, and protect an internal heating component. In another aspect, when the housing 10 is impacted by external force, the gap area in the double-layer housing structure may be used as a buffer to effectively prevent an internal structure of the power adapter 100 from being damaged due to an impact, thereby greatly improving an impact resistance capability of the housing 10, and enabling the housing 10 to meet a requirement of a higher impact resistance level.

It should be noted that the sealing cavity 11 may be a vacuum environment, or may be a non-vacuum environment, provided that the sealing cavity 11 can adapt to circularly flowing of the cooling medium. This is not strictly limited in this embodiment.

With reference to FIG. 5, FIG. 6, FIG. 7, and FIG. 8, in a possible implementation, the housing 10 includes a middle housing 12 and a front cover 13 and a rear cover 14 that are respectively connected to two ends of the middle housing 12. The middle housing 12, the front cover 13, and the rear cover 14 form accommodation space through enclosure, and the circuit board component 40 is located inside the accommodation space. The middle housing 12 is disposed around the circuit board component 40, and is a part that is relatively directly affected by heat generated by the electronic element 42 on the circuit board 41, and is also a main contact part when a user uses the power adapter 100. For example, the pin 20 may be disposed on the front cover 13, and the USB interface 30 may be disposed on the rear cover 14.

Figure 5:
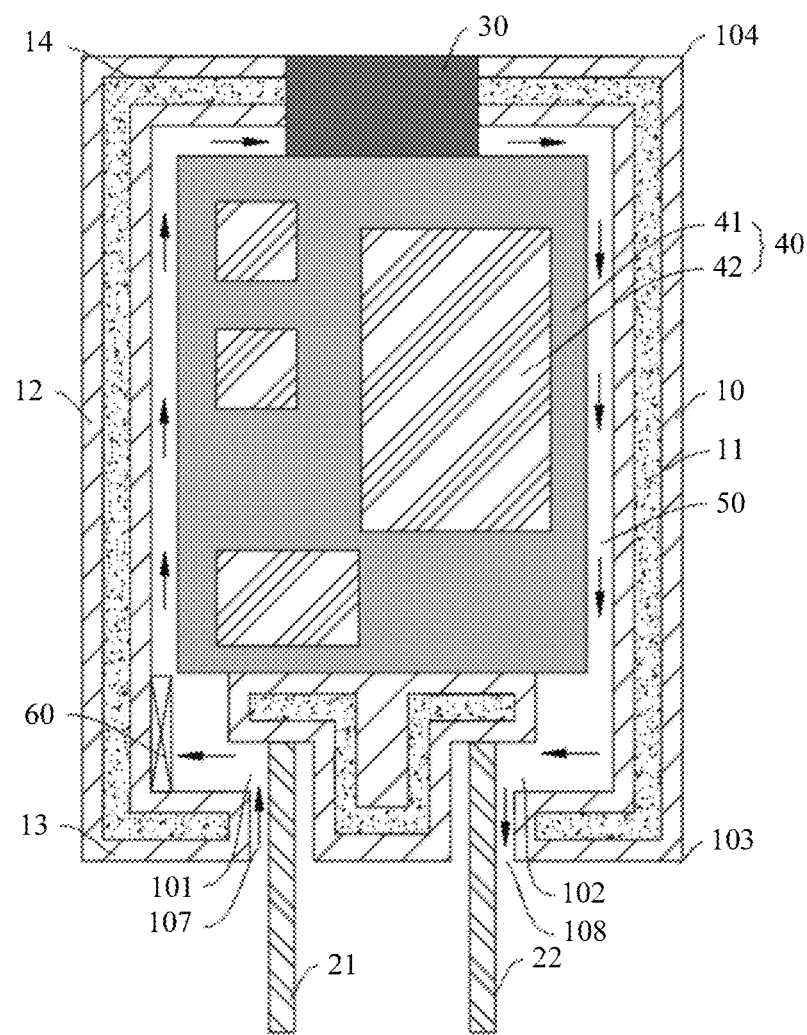
FIG. 5 is a schematic diagram of a fourth profile of a power adapter according to a first embodiment of this application.
Figure 6:
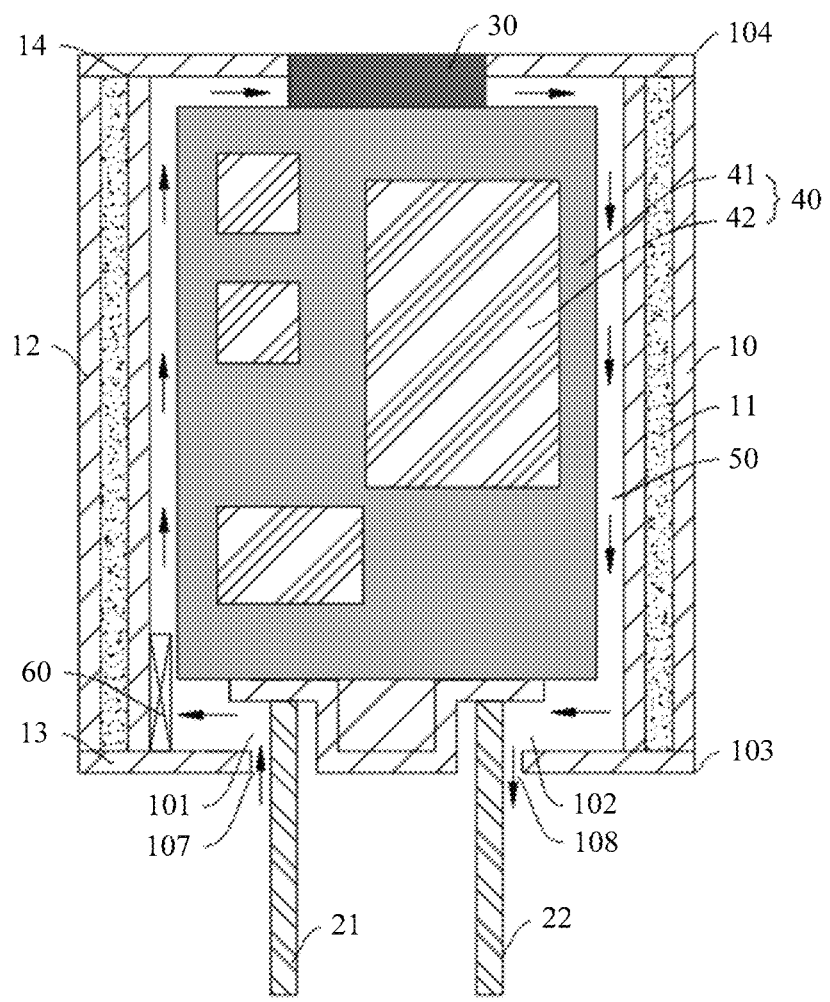
FIG. 6 is a schematic diagram of a fifth profile of a power adapter according to a first embodiment of this application.
Figure 7:
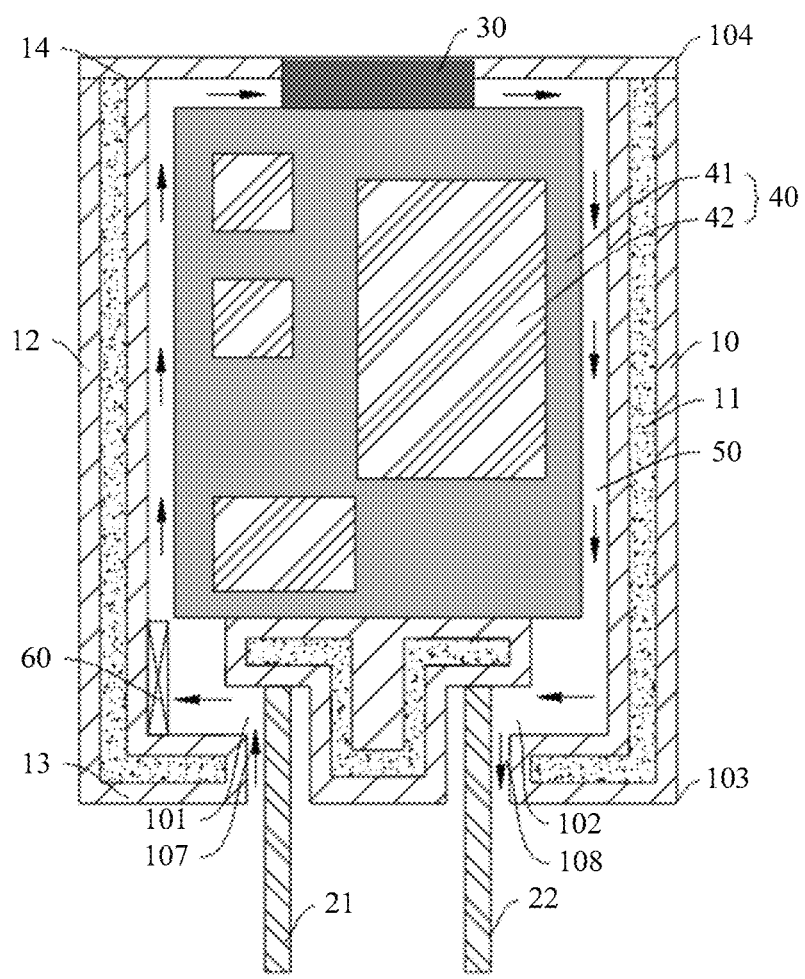
FIG. 7 is a schematic diagram of a sixth profile of a power adapter according to a first embodiment of this application.
Figure 8:
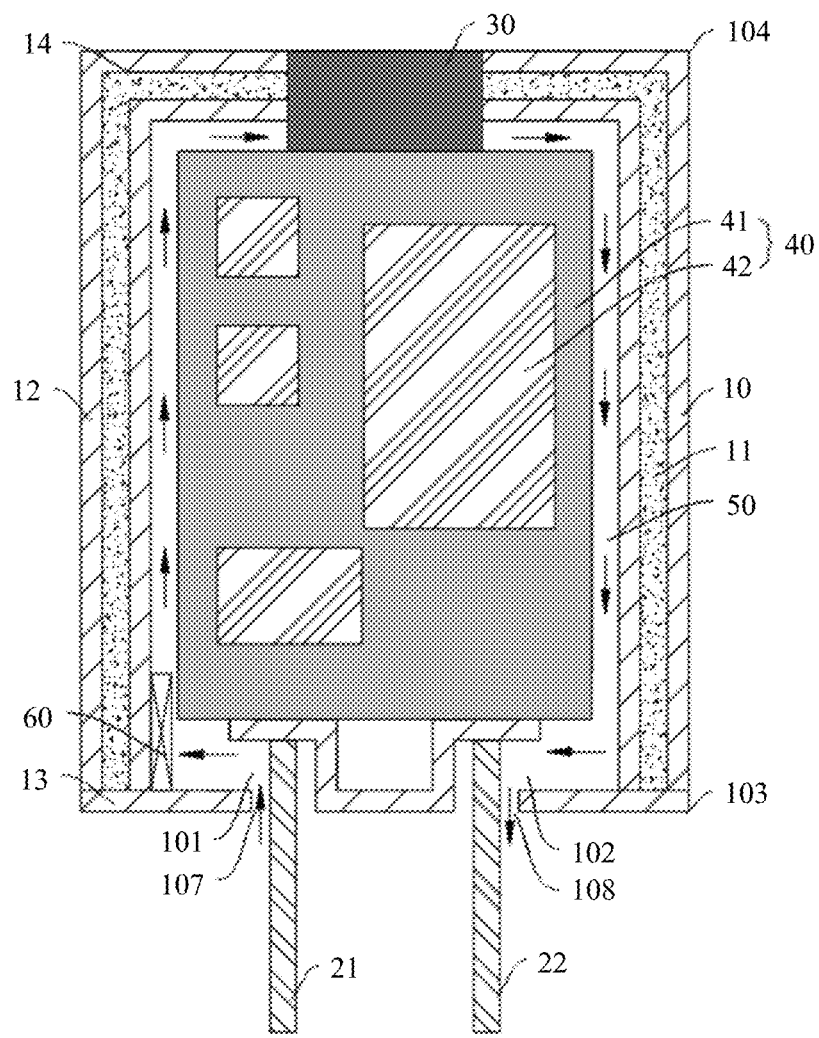
FIG. 8 is a schematic diagram of a seventh profile of a power adapter according to a first embodiment of this application.

The housing 10 may be completely in a double-layer housing structure, that is, the front cover 13, the rear cover 14, and the middle housing 12 shown in FIG. 5 each are in the double-layer housing structure. Alternatively, the housing 10 may be partially in a double-layer housing structure, that is, one or two of the middle housing 12, the front cover 13, and the rear cover 14 shown in FIG. 6, FIG. 7, and FIG. 8 each are in the double-layer housing structure. For example, the middle housing 12 shown in FIG. 6 is in the double-layer housing structure, the middle housing 12 and the front cover 13 shown in FIG. 7 each are in the double-layer housing structure, and the middle housing 12 and the rear cover 14 shown in FIG. 8 each are in the double-layer housing structure. In this way, at least the middle housing 12 is disposed as the double-layer housing structure, so as to better disperse and conduct heat generated by the electronic element 42 on the circuit board 41 to implement temperature uniformity of the housing 10, thereby helping improve an overall heat dissipation effect of the power adapter 100 and use experience of a user.

It should be understood that the front cover 13, the middle housing 12, and the rear cover 14 each may be in a separated structure, and may be connected through buckling, a snap-fit, fastening using a connector (such as a screw), or the like. A plurality of the front cover 13, the middle housing 12, and the rear cover 14 may be in an integrated structure. For example, the middle housing 12, the front cover 13, and the rear cover 14 are in the integrated structure, or the middle housing 12 and the front cover 13 are in the integrated structure, or the middle housing 12 and the rear cover are in the integrated structure. The integrated structure is relatively easy to process, which helps reduce material processing costs of the power adapter 100 and improve production efficiency of the power adapter 100. In addition, materials of the front cover 13, the middle housing 12, and the rear cover 14 may be the same or may be different. When a plurality of structures in the front cover 13, the middle housing 12, and the rear cover 14 each have a double-layer housing structure, the plurality of structures may have a same double-layer housing structure, or may have different double-layer housing structures. This is not strictly limited in this embodiment.

Embodiment 2

Figure 10:
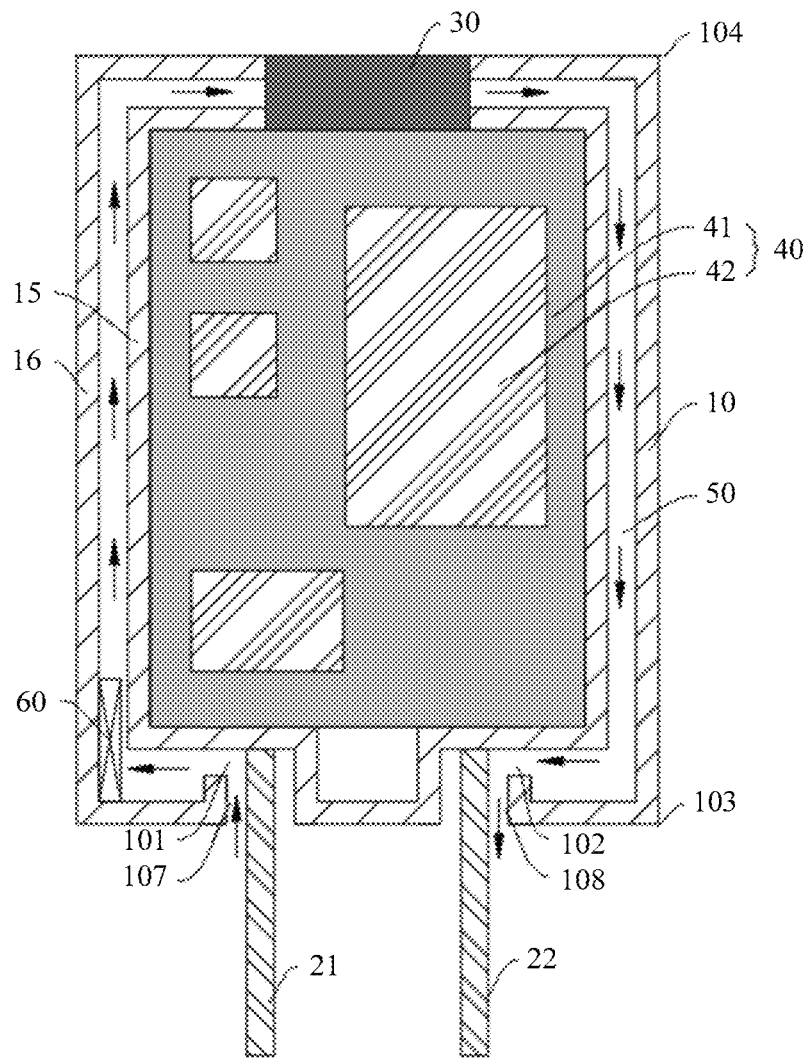
FIG. 10 is a schematic diagram of a profile of a power adapter according to a second embodiment of this application.
Figure 11:
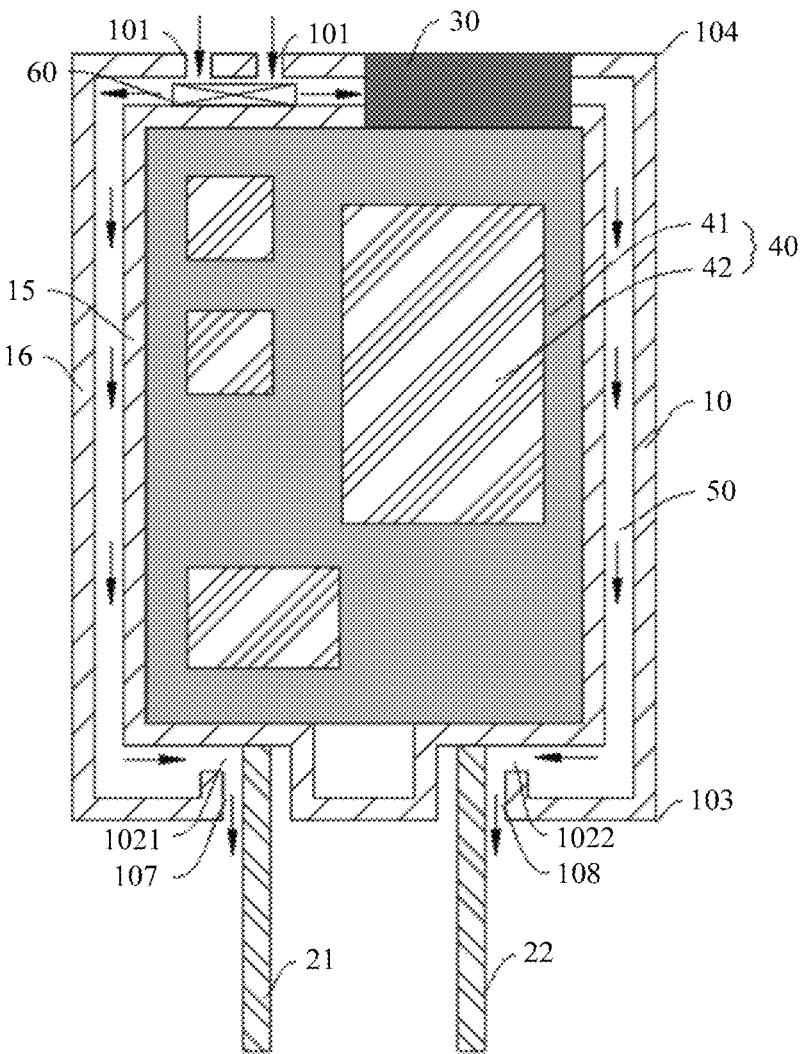
FIG. 11 is a schematic diagram of another profile of a power adapter according to a second embodiment of this application.

With reference to FIG. 1, FIG. 10, and FIG. 11, in a second embodiment of this application, each structure form of the power adapter 100 in the first embodiment may be applied to a structure form of the power adapter 100 in the following second embodiment when there is no conflict. In this embodiment, content the same as that in the first embodiment is not described again. Different from the first embodiment, the heat dissipation air duct 50 is located in the housing 10.

The housing 10 includes an inner-layer housing 15 and an outer-layer housing 16 disposed on a periphery of the inner-layer housing 15. There is a gap between the inner-layer housing 15 and the outer-layer housing 16, and a gap area between the inner-layer housing 15 and the outer-layer housing 16 forms the heat dissipation air duct 50. Both the air inlet 101 and the air outlet 102 are disposed on the outer-layer housing 16.

In this way, disposing of the inner-layer housing 15 and the outer-layer housing 16 enables the housing 10 to be in the double-layer housing structure, and the spacing area between the inner-layer housing 15 and the outer-layer housing 16 forms the heat dissipation air duct 50, so that a structure form of the housing 10 can be fully used. Therefore, when a temperature of the housing 10 rises due to heating of an element inside the power adapter 100, air can rapidly circularly flow in the heat dissipation air duct 50 to take away heat of the power adapter 100, thereby fully ensuring temperature uniformity performance of the housing 10. In one aspect, this helps greatly reduce a temperature at a maximum temperature point, and protect an internal heating component. In another aspect, when the housing 10 is impacted by external force, the gap area between the inner-layer housing 15 and the outer-layer housing 16 may be used as a buffer to effectively prevent an internal structure of the power adapter 100 from being damaged due to an impact, thereby greatly improving an impact resistance capability of the housing 10, and enabling the housing 10 to meet a requirement of a higher impact resistance level.

It should be noted that a material of the outer-layer housing 16 may be the same as or different from a material of the inner-layer housing 15. This is not strictly limited in this embodiment. That the material of the outer-layer housing 16 is different from the material of the inner-layer housing 15 is described below in detail.

For example, the material of the outer-layer housing 16 may include one or more types of hard plastic. The hard plastic may be but is not limited to polycarbonate (PC), polyvinyl chloride (PVC), polyolefin, polyphenylene ether, polysulfone, epoxy resin, phenolic resin, amino resin, silyl ether resin, and polyamide. The hard plastic has relatively low thermal conductivity, which helps keep a temperature of an outer surface of the outer-layer housing 16 at a relatively low level, thereby improving temperature experience when a user holds the power adapter 100. In addition, the hard plastic has low costs and is easy to form, and can better match requirements of adapters of different models and shapes. The hard plastic also has a relatively high shape keeping capability, so as to effectively avoid occurrence of a problem that adapter appearance and stability of an internal electronic element are affected due to deformation of the housing 10 that is caused by an impact and a fall.

The material of the inner-layer housing 15 may include one or more deformable flexible materials, and the deformable flexible materials may be rubber or resin materials. The deformable flexible material can alleviate force generated on the housing 10 by flowing of air, so as to improve structure stability of the housing 10, and also provide buffer space for an impact.

In this embodiment, to improve heat dissipation performance of the housing 10, thermal conductivity of the inner-layer housing 15 may be greater than thermal conductivity of the outer-layer housing 16. To be specific, the outer-layer housing 16 may be formed by using a material with relatively small thermal conductivity to keep an external touch temperature of the housing 10 at an acceptable low level. The inner-layer housing may be formed by using a material with relatively large thermal conductivity to better conduct and disperse heat inside the adapter, thereby helping disperse heat from the inside to the outside.

For example, the inner-layer housing 15 may include one or more phase change materials (PCM). The phase change material may be an organic phase change material with a heat storage function, such as a paraffin wax, polyol, or fatty acid (such as acetic acid); or may be an inorganic phase change material with a heat storage function, such as metal with a low melting point, alloy, hydrated salt, molten salt, or ionic liquid. The phase change material is a material that changes a substance state when a temperature does not change, and can provide latent heat, and a process of changing a physical property by the phase change material is referred to as a phase change process. In the phase change process, the phase change material absorbs or releases a large amount of latent heat. The phase change material has a phase change function, and can store heat energy after absorbing the heat energy, so as to maintain a temperature of the phase change material unchanged. Therefore, a temperature rise time of the housing 10 can be delayed, thereby optimizing product performance and improving user experience.

A phase change material changing from a solid stated to a liquid state is used as an example. When the power adapter 100 works, after the phase change material absorbs and stores heat energy, a phase change in which the solid state is changed to the liquid state gradually occurs and a temperature is constant. When the power adapter 100 does not work, after releasing heat stored in the phase change material, the phase change material changes from the liquid state to the solid state. After absorbing heat energy, the phase change material has a constant temperature and changes a phase state.

In this embodiment, a thickness of the outer-layer housing 16 may be greater than a thickness of the inner-layer housing 15. As a main layer structure that is of the housing 10 and that provides strength, the out-layer housing 16 has a relatively large thickness, so that strength of the housing 10 can be better ensured, thereby improving impact resistance performance of the housing 10. As an inner structure that defines the heat dissipation air duct 50, the inner-layer housing 15 may have a relatively small thickness to reduce a total thickness of the housing 10 as far as possible while ensuring that the housing 10 can be safely used, thereby reducing an overall size of the power adapter 100 and adapting to an adapter miniaturization requirement. Certainly, the thickness of the outer-layer housing 16 may be equal to the thickness of the inner-layer housing 15, or the thickness of the outer-layer housing 16 may be less than the thickness of the inner-layer housing 15. This is not strictly limited in this embodiment.

An appearance structure of the outer-layer housing 16 and an appearance structure of the inner-layer housing 15 may be the same, for example, both are rectangular. Alternatively, the appearance structure of the outer-layer housing 16 may be different from the appearance structure of the inner-layer housing 15. For example, the appearance structure of the outer-layer housing 16 is rectangular, and the appearance structure of the inner-layer housing 15 is oval. An overall appearance outline of the housing 10 may be a rectangle or a rectangle-like structure, or may be a structure of another shape. This is not strictly limited in this embodiment, and may be specifically determined based on a product appearance design requirement of the power adapter 100.

In this embodiment, an inner wall of the housing 10 (that is, a surface that is of the inner-layer housing 15 and that is away from the outer-layer housing 16) and the circuit board component 40 may be directly connected to each other, may be connected to each other by using a thermally conductive medium, or there may be a specific gap between the inner wall of the housing 10 and the circuit board component 40. For example, the thermally conductive medium may be a thermally conductive adhesive, a thermally conductive pad, a thermally conductive gasket or a thermally conductive carbon fiber.

In a possible implementation, to further improve a temperature uniformity effect, a heat dissipation effect, and the like, a heat dissipation part that facilitates heat dissipation at a uniform temperature may be further disposed on the circuit board component 40. The heat dissipation part may be disposed corresponding to the electronic element 42 on the circuit board 41, for example, may be attached to a surface of the electronic element 42. A specific structure form of the heat dissipation part is not limited, provided that the heat dissipation part can dissipate heat at a uniform temperature. For example, the heat dissipation part may be thermally conductive metal foil, such as copper foil.

In another possible implementation, to further improve a heat dissipation effect, the inner wall of the housing 10 (for example, the inner-layer housing 15 and/or the outer-layer housing 16) may be disposed as a rough surface or a roughness structure, so as to better absorb heat and dissipate heat, thereby improving the heat dissipation effect. For example, a heat-dissipation fin may be disposed on the inner wall of the housing 10.

Embodiments of this application are described in detail above. The principle and implementation of this application are described herein through specific examples. The description about the embodiments of this application is merely provided to help understand the method and ideas of this application. In addition, a person of ordinary skill in the art can make variations and modifications to this application in terms of the specific implementations and application scopes based on the ideas of this application. Therefore, the content of specification shall not be construed as a limit to this application.

What is claimed is:

1. A power adapter, wherein the power adapter comprises: a housing, wherein the housing has an air inlet and an air outlet; a circuit board component, wherein the circuit board component is located inside the housing; a heat dissipation air duct, wherein the heat dissipation air duct is located in the housing, wherein the heat dissipation air duct surrounds the circuit board component and is connected to the air inlet and the air outlet, and wherein the heat dissipation air duct is configured to dissipate heat from the housing, the circuit board component and the combination of the housing and the circuit board component; and wherein the housing comprises a first surface, a first accommodation groove for accommodating a first pin and a second accommodation groove for accommodating a second pin that are disposed on the first surface, and the first accommodation groove and the second accommodation groove are disposed at intervals, and wherein the air inlet is disposed on a groove wall of the first accommodation groove, and the air outlet is disposed on a groove wall of the second accommodation groove.

2. The power adapter according to claim 1, wherein the housing comprises a first surface and a second surface that are disposed opposite to each other, a first accommodation groove for accommodating a first pin and a second accommodation groove for accommodating a second pin that are disposed on the first surface, and the first accommodation groove and the second accommodation groove are disposed at intervals, and wherein the air inlet is disposed on the second surface, the air outlet comprises a first sub-air outlet and a second sub-air outlet, the first sub-air outlet is disposed on a groove wall of the first accommodation groove, and the second sub-air outlet is disposed on a groove wall of the second accommodation groove.

3. The power adapter according to claim 1, wherein the power adapter further comprises a heat dissipation fan, and the heat dissipation fan is located in the heat dissipation air duct and is disposed close to the air inlet.

4. The power adapter according to claim 1, wherein, while the heat dissipation air duct is located in a spacing area between the housing and the circuit board component, at least a part of the housing is in a double-layer housing structure, and wherein a gap area in the double-layer housing structure forms a sealing cavity, and the sealing cavity is filled with a cooling medium.

5. The power adapter according to claim 4, wherein the housing comprises a middle housing, and a front cover and a rear cover that are respectively connected to two ends of the middle housing, and at least one of the middle housing, the front cover, or the rear cover each is in the double-layer housing structure.

6. The power adapter according to claim 5, wherein the middle housing, the front cover, and the rear cover are in an integrated structure, or the middle housing and the front cover are in an integrated structure, or the middle housing and the rear cover are in an integrated structure.

7. The power adapter according to claim 1, wherein the housing comprises an inner-layer housing, and an outer-layer housing disposed on a periphery of the inner-layer housing, wherein there is a gap between the inner-layer housing and the outer-layer housing, and wherein a gap area between the inner-layer housing and the outer-layer housing forms the heat dissipation air duct.

8. The power adapter according to claim 7, wherein thermal conductivity of the inner-layer housing is greater than thermal conductivity of the outer-layer housing.

9. The power adapter according to claim 7, wherein an inner wall of the housing is directly in contact with the circuit board component; or
  the inner wall of the housing is connected to the circuit board component by using a thermally conductive medium; or
  there is a gap between the inner wall of the housing and the circuit board component.

10. The power adapter according to claim 1, wherein the power adapter comprises an antistatic structure, at least a part of the antistatic structure is located at at least one of the air inlet or the air outlet, and wherein the antistatic structure is electrically connected to the circuit board component.

11. A power adapter, wherein the power adapter comprises: a housing, wherein the housing has an air inlet and an air outlet; a circuit board component, wherein the circuit board component is located inside the housing; a heat dissipation air duct, wherein the heat dissipation air duct is located in a spacing area between the housing and the circuit board component, wherein the heat dissipation air duct surrounds the circuit board component and is connected to the air inlet and the air outlet, and wherein the heat dissipation air duct is configured to dissipate heat from the housing, the circuit board component and the combination of the housing and the circuit board component; and wherein the housing comprises a first surface, a first accommodation groove for accommodating a first pin and a second accommodation groove for accommodating a second pin that are disposed on the first surface, and the first accommodation groove and the second accommodation groove are disposed at intervals, and wherein the air inlet is disposed on a groove wall of the first accommodation groove, and the air outlet is disposed on a groove wall of the second accommodation groove.

12. The power adapter according to claim 11, wherein the housing comprises a first surface and a second surface that are disposed opposite to each other, a first accommodation groove for accommodating a first pin and a second accommodation groove for accommodating a second pin that are disposed on the first surface, and the first accommodation groove and the second accommodation groove are disposed at intervals, and wherein the air inlet is disposed on the second surface, the air outlet comprises a first sub-air outlet and a second sub-air outlet, the first sub-air outlet is disposed on a groove wall of the first accommodation groove, and the second sub-air outlet is disposed on a groove wall of the second accommodation groove.

13. The power adapter according to claim 11, wherein the power adapter further comprises a heat dissipation fan, and the heat dissipation fan is located in the heat dissipation air duct and is disposed close to the air inlet.

14. The power adapter according to claim 11, wherein at least a part of the housing is in a double-layer housing structure, and wherein a gap area in the double-layer housing structure forms a sealing cavity, and the sealing cavity is filled with a cooling medium.

15. The power adapter according to claim 14, wherein the housing comprises a middle housing, and a front cover and a rear cover that are respectively connected to two ends of the middle housing, and at least one of the middle housing, the front cover, or the rear cover each is in the double-layer housing structure.

16. The power adapter according to claim 15, wherein the middle housing, the front cover, and the rear cover are in an integrated structure, or the middle housing and the front cover are in an integrated structure, or the middle housing and the rear cover are in an integrated structure.

17. The power adapter according to claim 11, wherein the housing comprises an inner-layer housing, and an outer-layer housing disposed on a periphery of the inner-layer housing, wherein there is a gap between the inner-layer housing and the outer-layer housing, and wherein a gap area between the inner-layer housing and the outer-layer housing forms the heat dissipation air duct.

18. The power adapter according to claim 11, wherein the power adapter comprises an antistatic structure, at least a part of the antistatic structure is located at at least one of the air inlet or the air outlet, and wherein the antistatic structure is electrically connected to the circuit board component.

\* \* \* \* \*